US011443998B2

(12) United States Patent
Blackburn et al.

(10) Patent No.: US 11,443,998 B2
(45) Date of Patent: Sep. 13, 2022

(54) ELECTRONIC ASSEMBLY INCLUDING OPTICAL MODULES

(71) Applicant: TE CONNECTIVITY CORPORATION, Berwyn, PA (US)

(72) Inventors: Christopher William Blackburn, Bothell, WA (US); Jeffery Walter Mason, North Attleboro, MA (US); Nathan Lincoln Tracy, Harrisburg, PA (US); Clarence Leon Yu, Sacramento, CA (US); Michael David Herring, Apex, NC (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 307 days.

(21) Appl. No.: 16/869,888

(22) Filed: May 8, 2020

(65) Prior Publication Data
US 2020/0388548 A1 Dec. 10, 2020

Related U.S. Application Data

(60) Provisional application No. 62/857,570, filed on Jun. 5, 2019.

(51) Int. Cl.
*H01L 23/32* (2006.01)
*G02B 6/42* (2006.01)
(Continued)

(52) U.S. Cl.
CPC .............. *H01L 23/32* (2013.01); *G02B 6/428* (2013.01); *G02B 6/4269* (2013.01);
(Continued)

(58) Field of Classification Search
CPC ..... H01R 12/7076; H01R 12/85; H01L 23/32; H01L 23/267
(Continued)

(56) References Cited

U.S. PATENT DOCUMENTS 6,680,848 B2 * 1/2004 Petit .................... H01L 23/4006
361/704
6,746,261 B2 * 6/2004 Petit ....................... H05K 7/023
439/331
(Continued)

FOREIGN PATENT DOCUMENTS

| CN | 112055485 A | * | 12/2020 | ........... G02B 6/4201 |
| EP | 1630578 A2 | * | 3/2006 | ........... B23K 26/402 |

(Continued)

*Primary Examiner* — Alexander Gilman

(57) ABSTRACT

An electronic assembly includes an electronic package including a package substrate and an integrated circuit component mounted to an upper surface. The electronic package includes upper package contacts electrically connected to the integrated circuit component. The electronic assembly includes an interposer assembly including an array of compressible interposer contacts each having upper and lower mating interfaces. The interposer assembly defining a separable interface. The electronic assembly includes optical modules coupled to the separable interface of the interposer assembly and having an optical module substrate having module contacts and an optical engine mounted to the optical module substrate electrically connected to the module contacts. The optical module is mounted to the interposer assembly such that the module contacts are electrically connected to the upper mating interfaces of the interposer contacts. Each optical module includes at least one optical fiber terminated to the optical engine.

20 Claims, 11 Drawing Sheets

(51) Int. Cl.
*H01L 23/367* (2006.01)
*H01R 12/70* (2011.01)
*H01R 12/85* (2011.01)

(52) U.S. Cl.
CPC ....... *H01L 23/367* (2013.01); *H01R 12/7076* (2013.01); *H01R 12/85* (2013.01)

(58) Field of Classification Search
USPC ........................................................ 257/688
See application file for complete search history.

(56) References Cited

U.S. PATENT DOCUMENTS

| | | | | |
|---|---|---|---|---|
| 6,859,370 | B1* | 2/2005 | Hsu .................... | H05K 7/1061 |
| | | | | 361/728 |
| 7,032,305 | B2* | 4/2006 | Petit .................... | H01L 23/4006 |
| | | | | 29/829 |
| 7,298,622 | B2* | 11/2007 | Conner ............... | H01L 23/4006 |
| | | | | 257/E25.023 |
| 7,375,963 | B2* | 5/2008 | Eckberg ............. | H01L 23/4006 |
| | | | | 165/185 |
| 8,199,508 | B2* | 6/2012 | Min ..................... | H01L 23/427 |
| | | | | 361/679.52 |
| 9,581,776 | B1* | 2/2017 | Lee ..................... | G02B 6/4246 |
| 10,120,149 | B1* | 11/2018 | Mathai ............... | G02B 6/29365 |
| 10,566,287 | B1* | 2/2020 | Ding ................... | H01L 23/5384 |
| 10,795,091 | B2* | 10/2020 | Rosenberg ........... | G02B 6/4214 |
| 10,872,854 | B2* | 12/2020 | Raghunathan .... | H01L 23/49838 |
| 11,109,515 | B1* | 8/2021 | Nagarajan ............ | G02B 6/428 |
| 2006/0050493 | A1* | 3/2006 | Hamasaki ............ | G02B 6/4201 |
| | | | | 361/767 |
| 2012/0280344 | A1* | 11/2012 | Shastri ................ | G02B 6/4257 |
| | | | | 257/432 |
| 2013/0314707 | A1* | 11/2013 | Shastri ................ | G01B 11/14 |
| | | | | 356/399 |
| 2014/0042463 | A1* | 2/2014 | Uemura ............... | H01L 31/12 |
| | | | | 257/80 |
| 2014/0179129 | A1* | 6/2014 | Chan .................. | H01R 12/7029 |
| | | | | 439/78 |
| 2015/0063760 | A1* | 3/2015 | Pommer ............. | G02B 6/4246 |
| | | | | 385/79 |
| 2015/0139590 | A1* | 5/2015 | Oniki .................. | G02B 6/3853 |
| | | | | 385/79 |
| 2015/0168646 | A1* | 6/2015 | Arai ..................... | G02B 6/122 |
| | | | | 385/33 |
| 2016/0359568 | A1* | 12/2016 | De Dobbelaere .... | H04B 10/801 |
| 2017/0115458 | A1* | 4/2017 | Mekis ................. | G02B 6/4208 |
| 2017/0199328 | A1* | 7/2017 | Shubin ................ | H01S 5/0225 |
| 2017/0269316 | A1* | 9/2017 | Chang ................ | G02B 6/4245 |
| 2017/0276885 | A1* | 9/2017 | Dubey ............... | G02B 6/4244 |
| 2019/0137708 | A1* | 5/2019 | Ochi ................... | G02B 6/4214 |
| 2019/0285804 | A1* | 9/2019 | Ramachandran ........ | G02B 6/30 |
| 2019/0310433 | A1* | 10/2019 | Yoo .................... | G02B 6/428 |
| 2019/0316959 | A1* | 10/2019 | Halliday ............. | G01S 17/04 |
| 2020/0388548 | A1* | 12/2020 | Blackburn ........... | H01R 12/85 |
| 2021/0048587 | A1* | 2/2021 | Denoyer ............. | G02B 6/4249 |
| 2021/0274673 | A1* | 9/2021 | Blackburn ........... | H05K 7/1061 |

FOREIGN PATENT DOCUMENTS

| | | | | |
|---|---|---|---|---|
| EP | 3220174 A1 | * | 9/2017 | ................ G02B 6/32 |
| JP | 2005286225 A | * | 10/2005 | ............ G02B 6/4201 |
| WO | WO-2012141541 A2 | * | 10/2012 | ................ G02B 6/12 |
| WO | WO-2015132849 A1 | * | 9/2015 | .......... G02B 6/02042 |

\* cited by examiner

ELECTRONIC ASSEMBLY INCLUDING OPTICAL MODULES

CROSS REFERENCE TO RELATED APPLICATIONS

This application claims benefit to U.S. Provisional Application No. 62/857,570, filed 5, Jun. 2019, titled "ELECTRONIC ASSEMBLY INCLUDING OPTICAL MODULES", the subject matter of which is herein incorporated by reference in its entirety.

BACKGROUND OF THE INVENTION

The subject matter herein relates generally to electronic assemblies.

There is an ongoing trend toward smaller, lighter, and higher performance communication components and higher density systems, such as for ethernet switches or other system components. Typically, the system includes a socket connector mounted to a host circuit board. The socket connector receives an electronic package, such as an ASIC. Electrical signals are routed between the ASIC and the host circuit board through the socket connector. The electrical signals are then routed along traces on the host circuit board to another component, such as a transceiver connector. The long electrical paths through the host circuit board reduce electrical performance of the system. Additionally, the routing of the circuits between the socket connector and the other components on the host circuit board occupies board space on the host circuit board. Conventional systems are struggling with meeting signal and power output from the electronic package because there is a need for smaller size and higher number of conductors while maintaining good electrical performance through the system.

A need remains for a reliable electronic assembly for high speed data signaling for data communication systems.

BRIEF DESCRIPTION OF THE INVENTION

In one embodiment, an electronic assembly is provided. The electronic assembly includes an electronic package including a package substrate having an upper surface and a lower surface. The electronic package includes an integrated circuit component mounted to the upper surface of the package substrate. The electronic package includes lower package contacts electrically connected to the integrated circuit component and is electrically connected to a host circuit board. The electronic package includes upper package contacts electrically connected to the integrated circuit component. The electronic assembly includes an interposer assembly including an array of interposer contacts. The interposer contacts are compressible. Each interposer contact has an upper mating interface and a lower mating interface. The lower mating interfaces of the interposer contacts are mated with the upper package contacts. The electronic assembly includes optical modules that are coupled to the upper surface of the package substrate. Each optical module includes an optical module substrate having module contacts and an optical engine mounted to the optical module substrate electrically connected to the module contacts. The optical module is mounted to the interposer assembly such that the module contacts are electrically connected to the upper mating interfaces of the interposer contacts. Each optical module includes at least one optical fiber terminated to the optical engine.

In another embodiment, an electronic assembly is provided. The electronic assembly includes an electronic package including a package substrate having an upper surface and a lower surface. The electronic package includes an integrated circuit component mounted to the upper surface of the package substrate. The electronic package includes lower package contacts electrically connected to the integrated circuit component and is electrically connected to a host circuit board. The electronic package includes upper package contacts electrically connected to the integrated circuit component. The electronic assembly includes an interposer assembly including an array of interposer contacts. The interposer contacts are compressible. Each interposer contact has an upper mating interface and a lower mating interface. The lower mating interfaces of the interposer contacts are mated with the upper package contacts. The electronic assembly includes optical modules coupled to the upper surface of the package substrate. Each optical module includes an optical module substrate having module contacts and an optical engine mounted to the optical module substrate electrically connected to the module contacts. The optical module is mounted to the interposer assembly such that the module contacts are electrically connected to the upper mating interfaces of the interposer contacts. Each optical module includes at least one optical fiber terminated to the optical engine. The electronic assembly includes optical module compression members coupled to the optical modules. The optical module compression members compress the compressible interposer contacts between the optical modules and the electronic package.

In a further embodiment, a communication system is provided. The communication system includes a socket connector including a socket frame having a socket opening receiving a socket substrate. The socket substrate includes socket contacts. The socket contacts are compressible. The socket connector is mounted to a host circuit board. The socket substrate is electrically connected to the host circuit board at a board interface. The communication system includes an electronic assembly coupled to the socket connector. The electronic assembly includes an electronic package including a package substrate having an upper surface and a lower surface. The electronic package includes an integrated circuit component mounted to the upper surface of the package substrate. The electronic package includes lower package contacts electrically connected to the integrated circuit component. The lower package contacts are electrically connected to the socket contacts. The electronic package includes upper package contacts electrically connected to the integrated circuit component. The electronic assembly includes an interposer assembly including an array of interposer contacts. The interposer contacts are compressible. Each interposer contact has an upper mating interface and a lower mating interface. The lower mating interfaces of the interposer contacts are mated with the upper package contacts. The electronic assembly includes optical modules coupled to the upper surface of the package substrate. Each optical module includes an optical module substrate having module contacts and an optical engine mounted to the optical module substrate electrically connected to the module contacts. The optical module is mounted to the interposer assembly such that the module contacts are electrically connected to the upper mating interfaces of the interposer contacts. Each optical module includes at least one optical fiber terminated to the optical engine. The communication system includes a compression assembly including a load plate mounted to the electronic assembly. The compression assembly includes a compression member engaging the load plate to press the load plate downward. The load plate is coupled to the electronic package to compress the socket contacts and electrically connect the lower package contacts to the socket contacts.

DETAILED DESCRIPTION OF THE INVENTION

Figure 1:
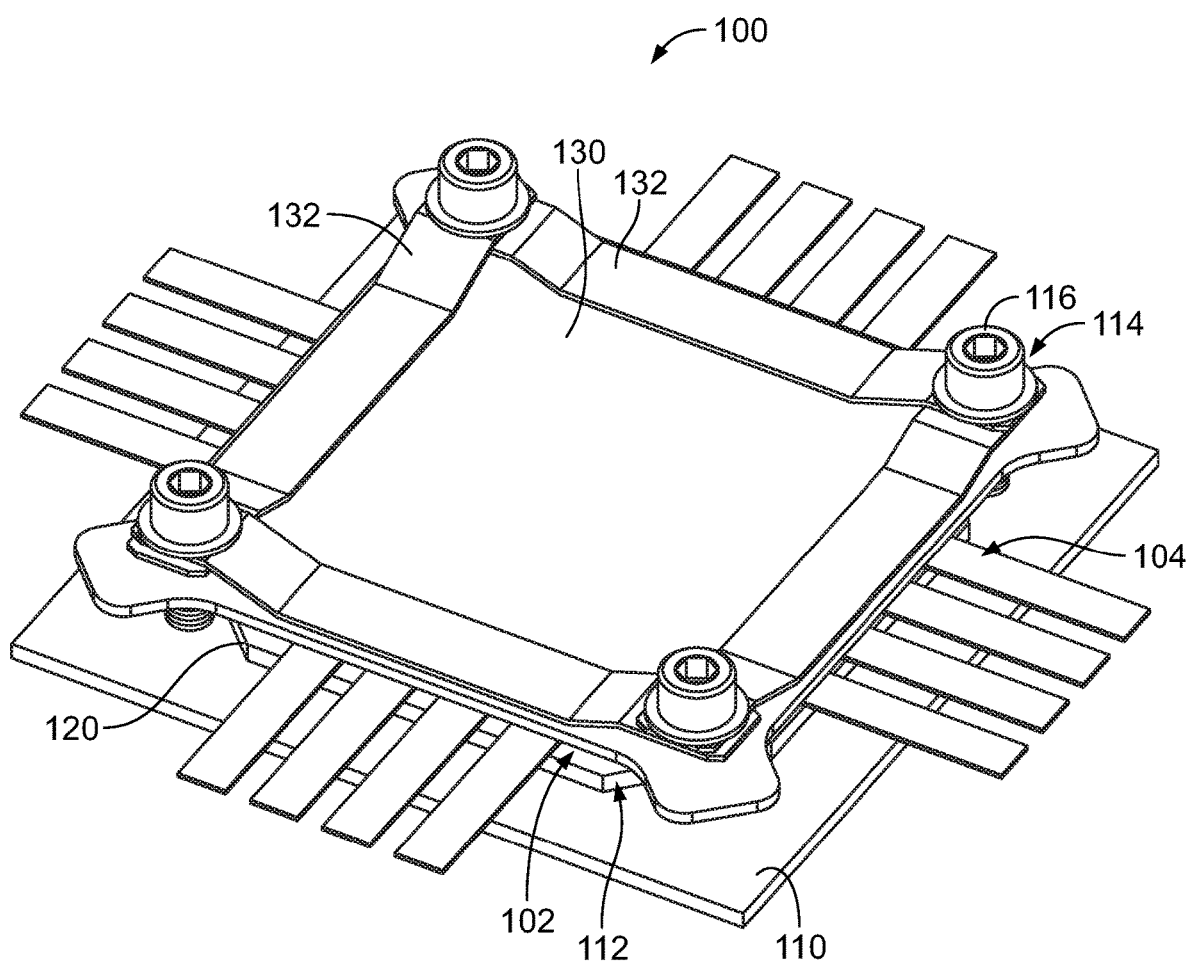
FIG. 1 is a perspective view of a communication system having an electronic assembly in accordance with an exemplary embodiment.
Figure 2:
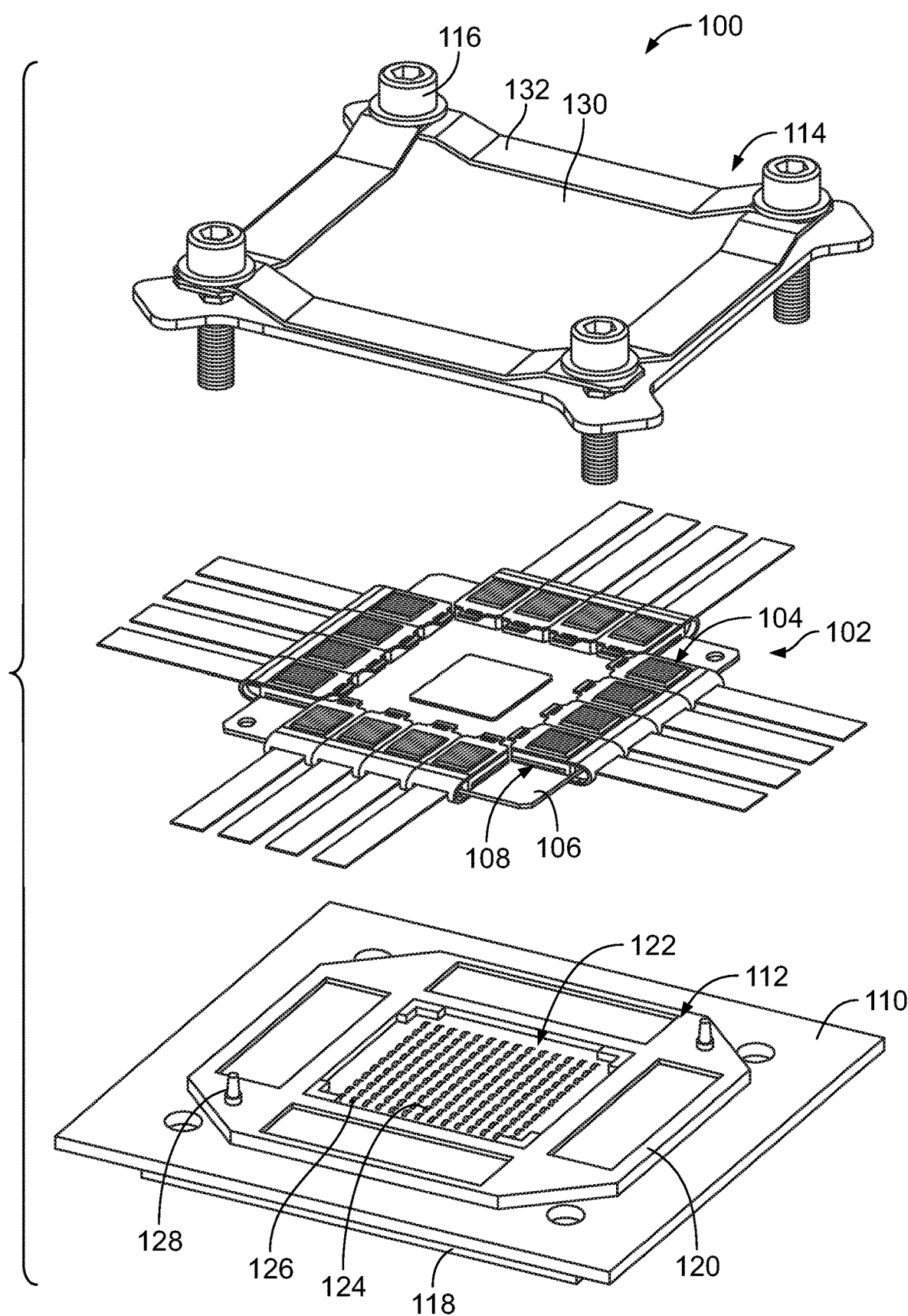
FIG. 2 is an exploded view of the communication system and the electronic assembly in accordance with an exemplary embodiment.

FIG. 1 is a perspective view of a communication system 100 having an electronic assembly 102 in accordance with an exemplary embodiment. FIG. 2 is an exploded view of the communication system 100 and the electronic assembly 102 in accordance with an exemplary embodiment. The electronic assembly 102 includes optical modules 104 (FIG. 2) electrically connected to an electronic package 106 (FIG. 2) by interposer assemblies 108 (FIG. 2). The electronic assembly 102 is electrically connected to a host circuit board 110, such as using a socket connector 112. In other various embodiments, the electronic assembly 102 is mounted directly to the host circuit board 110 without the use of the socket connector 112. In an exemplary embodiment, a compression assembly 114 is used to load the electronic assembly 102 to the socket connector 112 to electrically connect the electronic package 106 to the socket connector 112. For example, compression hardware 116, such as threaded fasteners, may be coupled to a bolster plate 118 below the host circuit board 110 to couple the compression assembly 114 to the host circuit board 110 and the electronic assembly 102. In an exemplary embodiment, the communication system 100 includes a heat sink (not shown) provided to dissipate heat from the electronic package 106 and/or the optical modules 104.

In various embodiments, the electronic package 106 is an integrated circuit assembly, such as an ASIC. However, the electronic package 106 may be another type of communication component. The optical modules 104 are mated directly to the ASIC via the interposer assemblies 108 independent of the host circuit board 110. For example, high-speed data signals are transmitted between the electronic package 106 and the optical modules 104 via the interposer assemblies 108 without the high-speed data signals passing through the host circuit board 110. In an exemplary embodiment, a plurality of optical modules 104 are coupled to the electronic package 106. For example, the optical modules 104 may be provided on multiple sides of the integrated circuit or other communication element of the electronic package 106. In the illustrated embodiment, the optical modules 104 are provided on all four sides of the integrated circuit. Other arrangements are possible in alternative embodiments. The optical modules 104 are individually clamped or compressed against the interposer assemblies 108 and are thus individually serviceable and removable from the electronic package 106.

The socket connector 112 includes a socket frame 120 having a socket opening 122. The socket connector 112 includes a socket substrate 124 are received in the socket opening 122. In the illustrated embodiment, the socket frame 120 surrounds the socket opening 122 on all four sides of the socket opening 122. The socket frame 120 may have a different shape in alternative embodiments. The bottom of the socket substrate 124 is mounted to the host circuit board 110 at a board interface. For example, the socket substrate 124 may be electrically connected to the host circuit board 110 by a ball grid array (BGA), a land grid array (LGA), or another mating interface. The socket connector 112 includes socket contacts 126 at the top of the socket substrate 124. In an exemplary embodiment, the socket contacts 126 are compressible contacts, such as spring beams, configured to be electrically connected to the electronic package 106. The compression assembly 114 may compress the socket contacts 126 when the compression assembly 114 is mounted to the host circuit board 110. In an exemplary embodiment, the socket connector 112 includes guide members 128 to guide mating of the electronic package 106 with the socket connector 112. For example, the guide members 128 may be guide pins extending from the top of the socket frame 120. Other types of guide members may be used in alternative embodiments.

The compression assembly 114 is coupled to the top of the electronic assembly 102 to mechanically and electrically connect the electronic assembly 102 to the socket connector 112. The compression assembly 114 includes a load plate 130 that is coupled to the bolster plate 118 by the compression hardware 116. The load plate 130 transfers the compression load to the electronic assembly 102. In an exemplary embodiment, the compression assembly 114 includes compression members 132 engaging the load plate 130. The compression members 132 are coupled to the compression hardware 116. In the illustrated embodiment, the compression members 132 are spring members configured to transfer spring forces from the compression hardware 116 to the load plate 130. Other types of compression members may be used in alternative embodiments. In the illustrated embodiment, the compression members 132 are provided on all four sides of the load plate 130; however, the compression members 132 may be coupled to other areas of the load plate 130 in alternative embodiments.

When assembled, the load plate 130 presses downward against the electronic assembly 102 to press the electronic package 106 against the socket contacts 126. The electronic package 106 compresses the socket contacts 126. The load plate 130 may be compressed against the integrated circuit or the substrate of the electronic package. In an exemplary embodiment, the load plate 130 may be compressed against the optical modules 104. The load plate 130 may press the optical modules 104 into the interposer assemblies 108. The compressive forces from the load plate 130 may be transferred to the socket contacts 126 through the compressive forces applied to the individual optical modules 104. In an exemplary embodiment, the load plate 130 may be thermally coupled to the optical modules 104. The load plate 130 may define a heat spreader for dissipating heat from the optical modules 104. The load plate 130 may be thermally coupled to the integrated circuit or other component of the electronic package 106. The load plate 130 may dissipate heat from the integrated circuit or other component of the electronic package 106. Optionally, a heat sink (not shown) may be thermally coupled to the load plate 130. In other various embodiments, the load plate 130 may include fins or other heat dissipating fins extending therefrom to dissipate heat directly into the air or environment around the communication system 100. In other various embodiments, heat pipes, a cold plate, or other heat dissipating structure may be thermally coupled to the load plate 130 to dissipate heat from the load plate 130.

Figure 3:
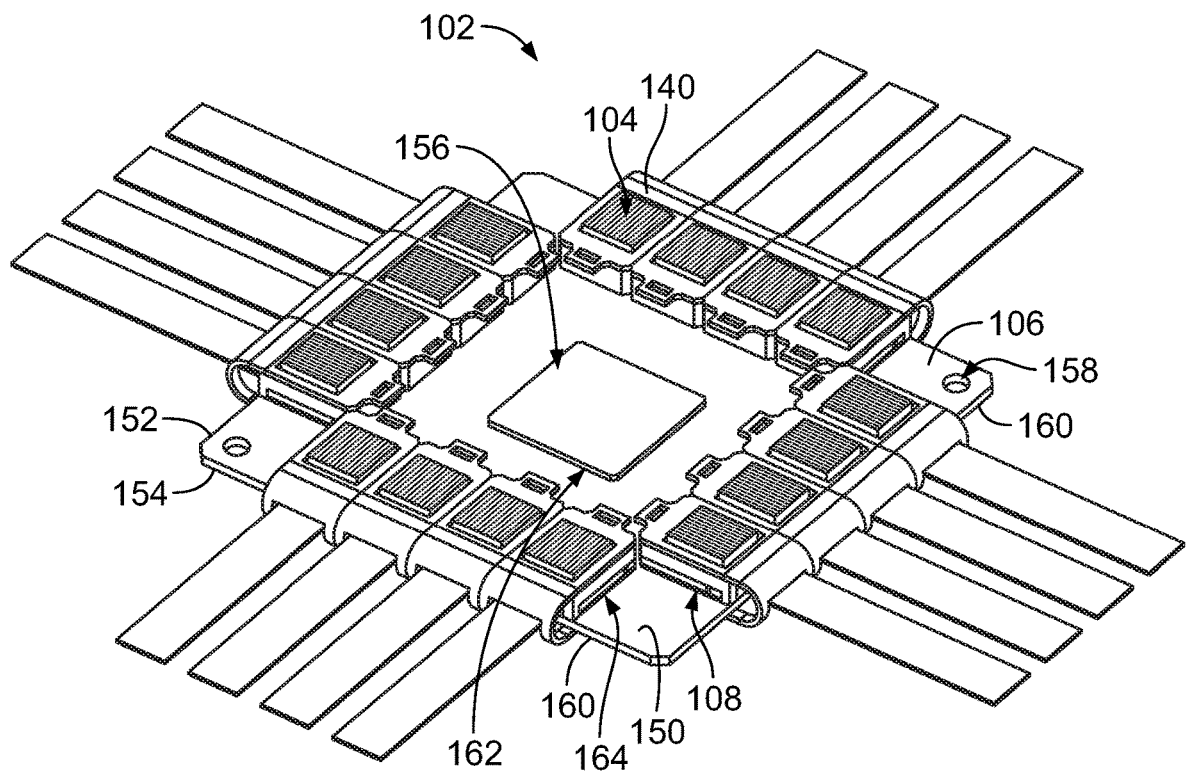
FIG. 3 is a perspective view of the electronic assembly in accordance with an exemplary embodiment.

FIG. 3 is a perspective view of the electronic assembly 102 in accordance with an exemplary embodiment. The electronic assembly 102 includes the electronic package 106 supporting a plurality of the optical modules 104. The interposer assemblies 108 electrically connect the optical modules 104 to the electronic package 106. In an exemplary embodiment, electronic assembly 102 includes optical module compression members 140 used to couple the optical modules 104 to the electronic package 106. The optical module compression members 140 compress the interposer assemblies 108 between the optical modules 104 and the electronic package 106.

In an exemplary embodiment, the interposer assemblies 108 define separable mating interfaces. For example, each interposer assembly 108 includes an upper separable mating interface, such as a compressible interface. As such, the optical modules 104 may be removable or replaceable. For example, during a testing process, each optical module 104 may be individually tested and adjusted or replaced to ensure that the electronic assembly is functional prior to assembly with the socket connector 112 (shown in FIG. 1). Each interposer assembly 108 may include a lower separable mating interface, such as a compressible interface. The contacts of the interposer assembly 108 may be compressible columnar contacts, such as conductive elastomeric contacts. In other embodiments, the contacts of the interposer assembly 108 may be stamped and formed contacts, such as including spring beams. The spring beams may be provided at the top and/or the bottom of the interposer assembly 108. The contacts may be press fit contacts, solder contacts, or other types of contacts in alternative embodiments. In various embodiments, a plurality of interposer assemblies 108 are mounted to the electronic package 106. For example, each optical module 104 is mounted to a separate interposer assembly 108. In alternative embodiments, a plurality of optical modules 104 may be mounted to a single interposer assembly 108. For example, separate interposer assemblies 108 may be provided along each side of the electronic package 106. In another embodiment, a single interposer assembly is provided extending along all four sides of the electronic package 106.

The electronic package 106 includes a package substrate 150 having an upper surface 152 and a lower surface 154. The electronic package 106 includes an integrated circuit component 156 mounted to the upper surface 152 of the package substrate 150. The integrated circuit component 156 may be a chip, an ASIC, a processor, a memory module or another component mounted to the top of the package substrate 150. In the illustrated embodiment, the integrated circuit component 156 is rectangular and approximately centered on the package substrate 150; however, the integrated circuit component 156 may have other shapes or locations in alternative embodiments. In an exemplary embodiment, the package substrate 150 includes locating features 158 for locating the electronic package 106 relative to the socket connector 112 (shown in FIG. 2). In the illustrated embodiment, the locating features 158 are openings through the package substrate 150. Other types of locating features may be used in alternative embodiments, such as channels, dimples, extensions, tabs, posts, pins, and the like.

The package substrate 150 includes edges 160 extending around the perimeter of the package substrate 150. In the illustrated embodiment, the package substrate 150 is rectangular shape having four perpendicular edges. The package substrate 150 may have other shapes including greater or fewer edges 160 in alternative embodiments. The integrated circuit component 156 is mounted to the package substrate 150 at a component mounting area 162, which may be approximately centered between the edges 160. The package substrate 150 includes package contacts (not shown) at the component mounting area 162 used to electrically connect the integrated circuit component 156 to the package substrate 150. The package contacts may be pads, traces, vias, and the like.

The package substrate 150 includes lower package contacts (not shown) at the lower surface 154 of the package substrate 150. The lower package contacts are used to electrically connect the electronic package 106 to the socket connector 112. For example, the lower package contacts are electrically connected to corresponding socket contacts 126 (shown in FIG. 2). In an exemplary embodiment, power and low-speed data signals are transmitted through the lower package contacts between the package substrate 150 and the socket connector 112. High speed data signals may additionally be transmitted through the lower package contacts. The lower package contacts are electrically connected to the integrated circuit component 156 via corresponding package contacts. In an exemplary embodiment, the lower package contacts may be approximately centered along the lower surface 154, such as directly below the component mounting area 162.

The package substrate 150 includes upper package contacts (not shown) at the upper surface 152 of the package substrate 150. The upper package contacts are used to electrically connect the electronic package 106 to the optical modules 104 via the interposer assemblies 108. In an exemplary embodiment, high-speed data signals are transmitted through the upper package contacts between the package substrate 150 and the optical modules 104. The upper package contacts are electrically connected to the integrated circuit component 156 via corresponding package contacts. In an exemplary embodiment, the upper package contacts are provided around the outer periphery of the package substrate 150. In an exemplary embodiment, the package substrate 150 includes mounting areas 164 around the outer periphery of the package substrate 150. The interposer assemblies 108 and the optical modules 104 are coupled to the package substrate 150 at the mounting areas 164. The mounting areas 164 are located between the integrated circuit component 156 at the component mounting area 162 and the edges 160. In the illustrated embodiment, the mounting areas 164 are provided along all four sides of the integrated circuit component 156 for the purpose of achieving short electrical traces (improved signal integrity) to/from the integrated circuit component 156.

The electronic assembly 102 has high channel density for data communication and power distribution to the integrated circuit component 156. For example, data channels are provided on both the upper surface 152 and the lower surface 154 of the package substrate 150. A subset of the data signals, such as the low speed and/or sideband data signals, are routed through the bottom of the electronic package 106 to the host circuit board 110 and a subset of the data signals, such as the high speed data signals, are routed through the top of the electronic package 106 to the optical modules 104. The performance and design efficiency are enhanced by increasing the number of data channels to the integrated circuit component 156. Furthermore, by routing the high-speed data signals directly to the optical modules 104, rather than routing the high-speed data signals through the host circuit board 110, the performance of the communication system 100 is enhanced. In an exemplary embodiment, the optical modules 104 are coupled to the electronic package 106 at multiple locations (e.g., at four sides of the chip) to increase density of the communication system 100 and shorten electrical paths of the communication system 100. The arrangement reduces the number of interfaces needed along the bottom of the package substrate 150 by routing the data channels to the top of the package substrate 150 for digital-to-optical conversion and take off by the optical modules 104. The optical modules 104 are individually separable from the electronic package 106 using the interposer assemblies 108. Each optical module 104 has its own compressive mating force using the corresponding optical module compression member 140. The optical module compression members 140 can be removed to service an individual optical module 104, such as to adjust or replace the optical module 104 after testing.

Figure 4:
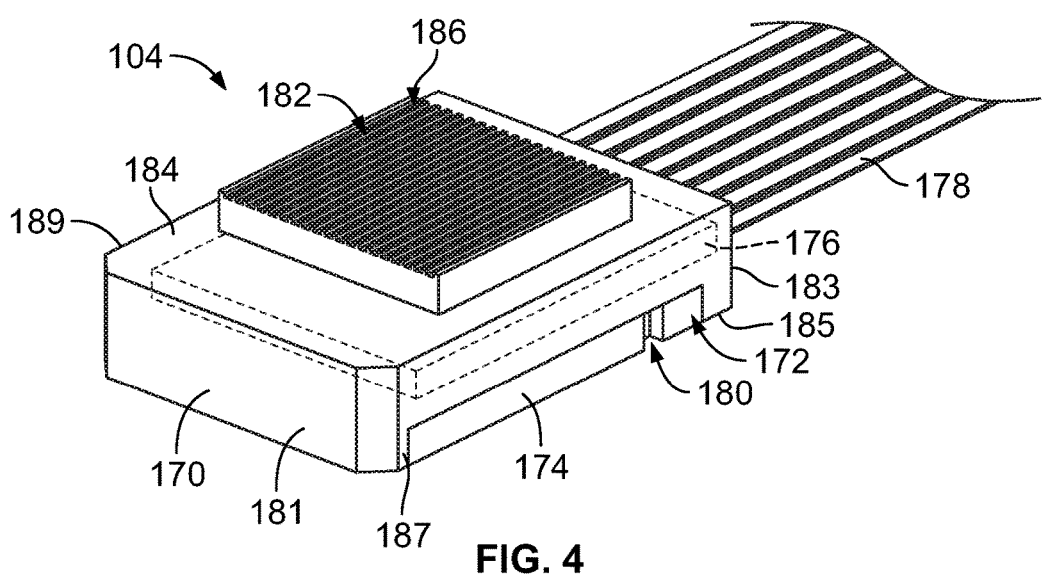
FIG. 4 is a perspective view of an optical module of the electronic assembly in accordance with an exemplary embodiment.

FIG. 4 is a perspective view of the optical module 104 in accordance with an exemplary embodiment. The optical module 104 includes an optical module housing 170 having a cavity 172 that receives an optical module substrate 174 and an optical engine 176 (shown in phantom). The optical module 104 includes one or more optical cables 178 extending from a rear 183 of the optical module housing 170. The optical cables 178 are terminated to the optical engine 176 and/or the optical module substrate 174. The optical cables 178 may be fiber-optic cables in various embodiments and may be direct attached or separable.

The optical module substrate 174 extends between a front 181 and a rear 183 of the optical module 104. The optical module substrate 174 is provided at a bottom 185 of the optical module 104. The optical module substrate 174 extends between sides 187, 189 of the optical module 104. The optical module substrate 174 may be a printed circuit board or other suitable material for routing electrical traces. The optical module substrate 174 includes module contacts (not shown) configured to be electrically connected to the interposer assembly 108 (shown in FIG. 3). For example, the module contacts may be pads on the bottom of the optical module substrate 174. In an exemplary embodiment, the optical module substrate 174 includes locating features 180 configured to locate the optical module 104 relative to the interposer assembly 108. In the illustrated embodiment, the locating features 180 are openings, such as holes in the optical module substrate 174. Other types of locating features 180 may be provided in alternative embodiments, such as protrusions or pins extending from the optical module substrate 174. The locating features 180 may be provided on another structure, such as the optical module housing 170 in alternative embodiments.

The optical engine 176 (shown in phantom in FIG. 4) is coupled to the optical module substrate 174, such as to the top of the optical module substrate 174. The optical engine 176 processes the electrical data signals. In an exemplary embodiment, the optical engine 176 includes an electrical-to-optical converter configured to convert between electrical signals and optical signals. The optical engine 176 may include other electrical components.

In an exemplary embodiment, the optical module 104 includes an optical module heat sink 182 for dissipating heat from the optical engine 176. The optical module heat sink 182 extends from the optical module housing 170. In an exemplary embodiment, the optical module heat sink 182 may be integral with the optical module housing 170. For example, the optical module housing 170 may be molded or otherwise formed to include the optical module heat sink 182. The optical module heat sink 182 may be a conductive thermoplastic material. In alternative embodiments, the optical module heat sink 182 may be separate and discrete from the optical module housing 170, such as being separately coupled to the optical module housing 170. The optical module heat sink 182 may be manufactured from a different material than the optical module housing 170, such as being manufactured from metal. In the illustrated embodiment, the optical module heat sink 182 is provided at a top 184 of the optical module housing 170. The optical module heat sink 182 includes a thermal interface 186 configured to be thermally coupled to another heat transfer component, such as the load plate 130 (shown in FIG. 1). Optionally, the thermal interface 186 may be compressible and/or deformable for engaging the heat transfer component. The optical module heat sink 182 may include plates, such as interleaved plates that are movable relative to each other. In alternative embodiments, the optical module heat sink 182 may include heat transfer fins or other heat dissipating elements.

Figure 5:
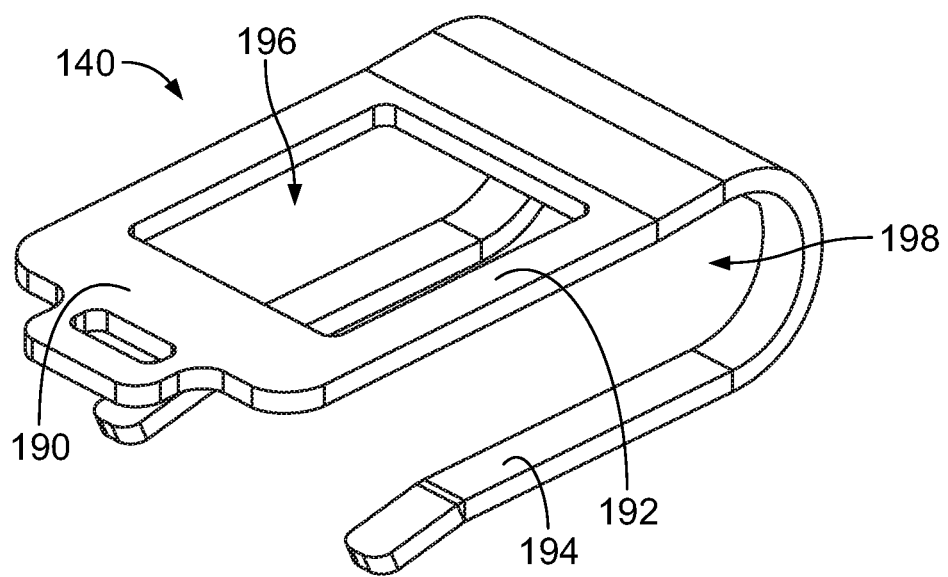
FIG. 5 is a perspective view of an optical module compression member of the electronic assembly in accordance with an exemplary embodiment.

FIG. 5 is a perspective view of the optical module compression member 140 in accordance with an exemplary embodiment. The optical module compression member 140 includes a biasing member 190 configured to engage the optical module 104 (shown in FIG. 3) to press downward against the optical module 104. In the illustrated embodiment, the optical module compression member 140 is a spring clip configured to be coupled to the optical module 104 and the electronic package 106 (shown in FIG. 3). Other types of compression elements may be used in alternative embodiments.

The optical module compression member 140 includes an upper arm 192 and a lower arm 194. The lower arm 194 is configured to engage the electronic package 106. The upper arm 192 defines the biasing member 190 configured to engage the optical module 104. In an exemplary embodiment, the upper arm 192 includes an opening 196 configured to receive the optical module heat sink 182 (shown in FIG. 4). In an exemplary embodiment, the lower arm 194 includes an opening 198 configured to receive the optical cables 178 (shown in FIG. 4). The optical module compression member 140 may have other shapes in alternative embodiments.

Figure 6:
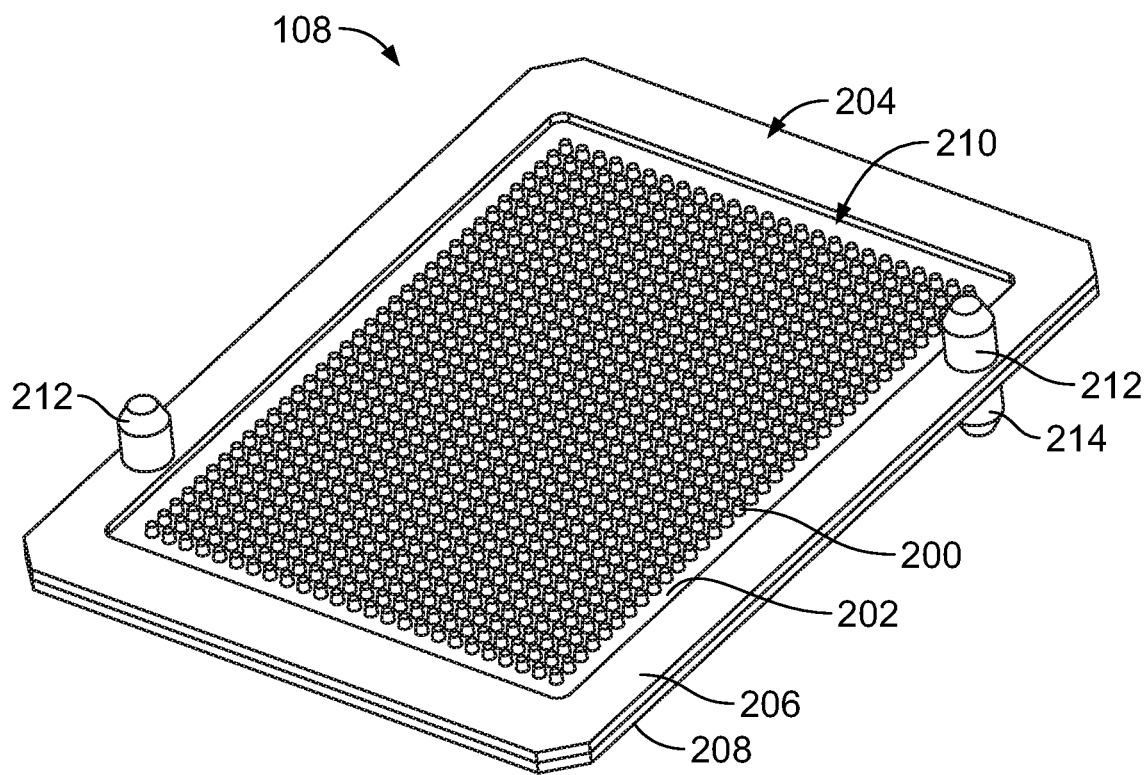
FIG. 6 is a perspective view of an interposer assembly of the electronic assembly in accordance with an exemplary embodiment.

FIG. 6 is a perspective view of the interposer assembly 108 in accordance with an exemplary embodiment. The interposer assembly 108 includes an array of interposer contacts 200 held together by a support plate 202 the interposer assembly 108 includes an interposer frame 204 holding the support plate 202 and the interposer contacts 200.

In an exemplary embodiment, the interposer frame 204 is a multipiece frame having an upper frame member 206 and a lower frame member 208. The support plate 202 is sandwiched between the upper frame member 206 and the lower frame member 208. In the illustrated embodiment, the interposer frame 204 extends around an outer periphery of the interposer assembly 108, such as along all four sides of the support plate 202. The interposer frame 204 may have other shapes in alternative embodiments. The interposer frame 204 includes openings 210 in the upper frame member 206 and the lower frame member 208. The openings 210 receive the interposer contacts 200.

In an exemplary embodiment, the interposer frame 204 includes upper locating pins 212 and lower locating pins 214. The upper locating pins 212 extend upward from the upper frame member 206. The upper locating pins 212 are used for locating the optical module 104 (shown in FIG. 4) relative to the interposer assembly 108. The upper locating pins 212 are received in the locating features 180 (shown in FIG. 4) of the optical module 104 to position the optical module 104 relative to the interposer frame 204 and the interposer contacts 200. The lower locating pins 214 extend downward from the lower frame member 208. The lower locating pins 214 are used for locating the interposer assembly 108 relative to the electronic package 106 (shown in FIG. 3). The lower locating pins 214 are received in the package substrate 150 (shown in FIG. 3) to position the interposer frame 204 and the interposer contacts 200 relative to the package substrate 150. Other types of locating features other than the locating pins 212, 214 may be used in alternative embodiments.

Figure 7:
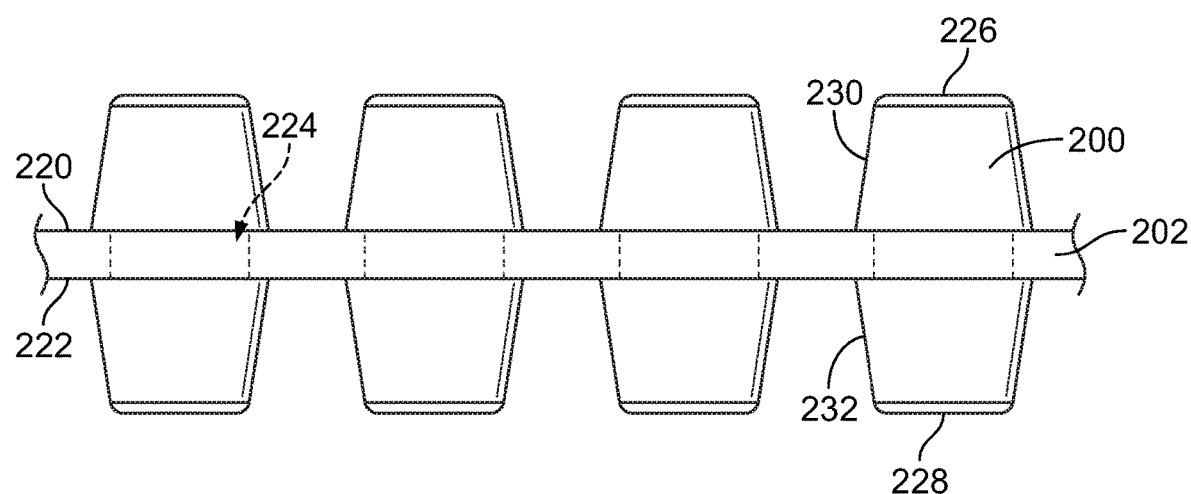
FIG. 7 is a side view of a portion of the interposer assembly in accordance with an exemplary embodiment.

FIG. 7 is a side view of a portion of the interposer assembly 108 showing the support plate 202 and a plurality of the interposer contacts 200. In an exemplary embodiment, the support plate 202 is a film having an upper surface 220 and a lower surface 222. The support plate 202 includes openings 224 therethrough holding corresponding interposer contacts 200. The support plate 202 is manufactured from an insulative material, such as a polyimide material, to electrically isolate the interposer contacts 200 from one another.

The interposer contacts 200 are held by the support plate 202. In an exemplary embodiment, the interposer contacts 200 are compressible contacts, such as conductive polymer columns. Each interposer contact 200 includes an upper mating interface 226 and a lower mating interface 228. The upper mating interface 226 is located above the upper surface 220 of the support plate 202 and the lower mating interface 228 is located below the lower surface 222 of the support plate 202. The interposer contacts 200 are compressible between the upper mating interfaces 226 and the lower mating interfaces 228. Optionally, the upper and lower mating interfaces 226, 228 may be planar interfaces oriented parallel to each other. Optionally, upper and lower sides 230, 232 of the interposer contacts 200 may be tapered. For example, the sides 230, 232 may be oriented nonparallel to the upper and lower mating interfaces 226, 228. The upper and lower portions of the interposer contacts 200 may be cone-shaped, such as being frusto-conical. Other types of interposer contacts 200 may be utilized in alternative embodiments.

Figure 8:
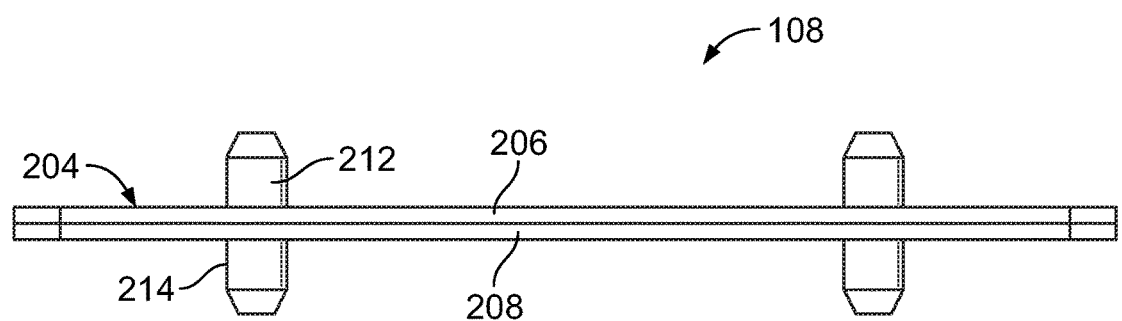
FIG. 8 is a side view of the interposer assembly in accordance with an exemplary embodiment.

FIG. 8 is a side view of the interposer assembly 108 in accordance with an exemplary embodiment. FIG. 8 illustrates the interposer frame 204 showing the upper frame member 206 and the lower frame member 208. The upper locating pins 212 extend from the upper frame member 206. The lower locating pins 214 extend from the lower frame member 208. Optionally, the upper locating pins 212 may be aligned with the lower locating pins 214. In alternative embodiments, the upper locating pins 212 may be offset relative to the lower locating pins 214.

Figure 9:
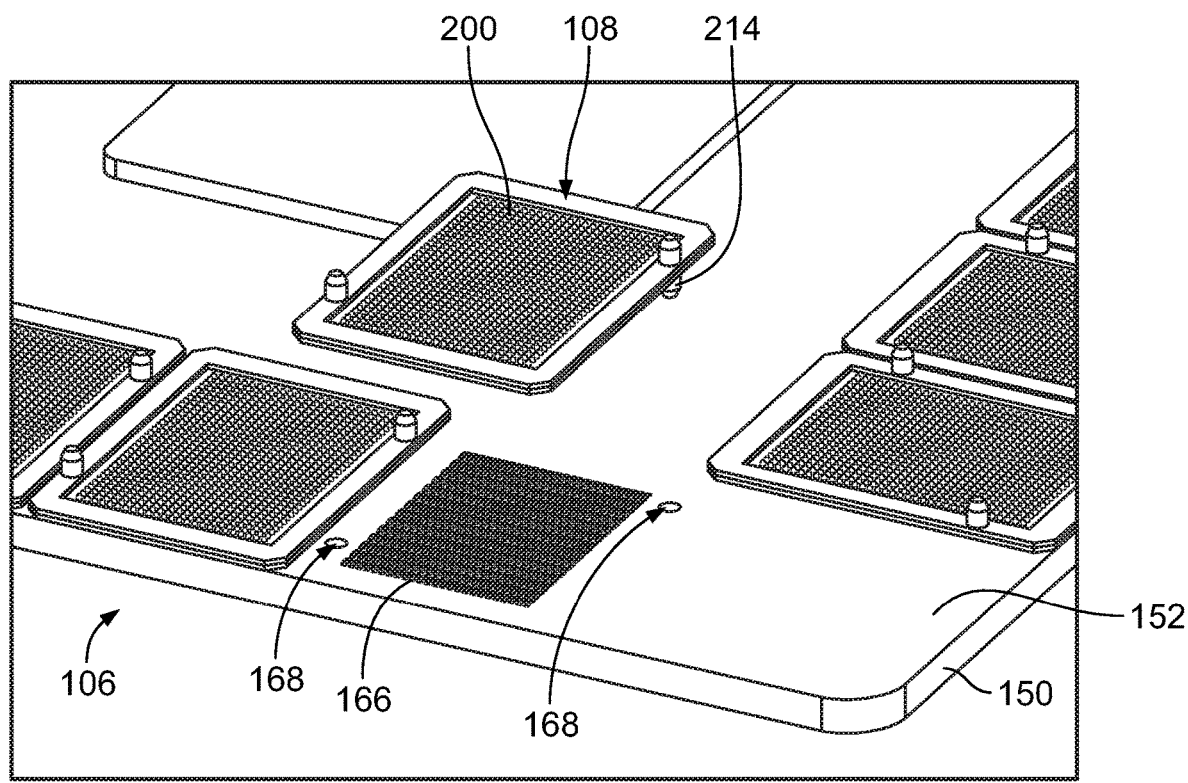
FIG. 9 is a perspective view of a portion of the electronic assembly in accordance with an exemplary embodiment.

FIG. 9 is a perspective view of a portion of the electronic assembly 102 in accordance with an exemplary embodiment showing one of the interposer assemblies 108 poised for mating with the electronic package 106. The package substrate 150 includes a plurality of upper package contacts 166 on the upper surface 152 of the package substrate 150. The upper package contacts 166 are arranged in an array complementary to the array of interposer contacts 200. The upper package contacts 166 may be signal contacts and/or ground contacts and/or power contacts.

The package substrate 150 includes interposer locating features 168 for locating the interposer assembly 108 relative to the electronic package 106. In the illustrated embodiment, the interposer locating features 168 are openings in the package substrate 150 configured to receive the lower locating pins 214 of the interposer assembly 108. Other types of locating features may be used in alternative embodiments, such as protrusions, posts, and the like.

In an exemplary embodiment, the interposer locating features 168 and the lower locating pins 214 are arranged to allow mating of the interposer assembly 108 in different orientations. For example, the interposer assembly 108 may be mounted in a first orientation as illustrated in FIG. 9. The interposer assembly 108 may be mounted in a second orientation rotated 180° from the first orientation with the lower locating pins 214 received in different interposer locating features 168. The interposer assembly 108 may be flipped or inverted upside down to a third orientation and coupled to the package substrate 150 (or may then be rotated 180° to a fourth orientation). The arrangement of the interposer contacts 200 and the upper package contacts 166 are arranged to accommodate the different mating orientations. In alternative embodiments, the interposer locating features 168 and the lower locating pins 214 may be oriented for keyed mating of the interposer assembly 108 with the electronic package 106 in a single orientation.

Figure 10:
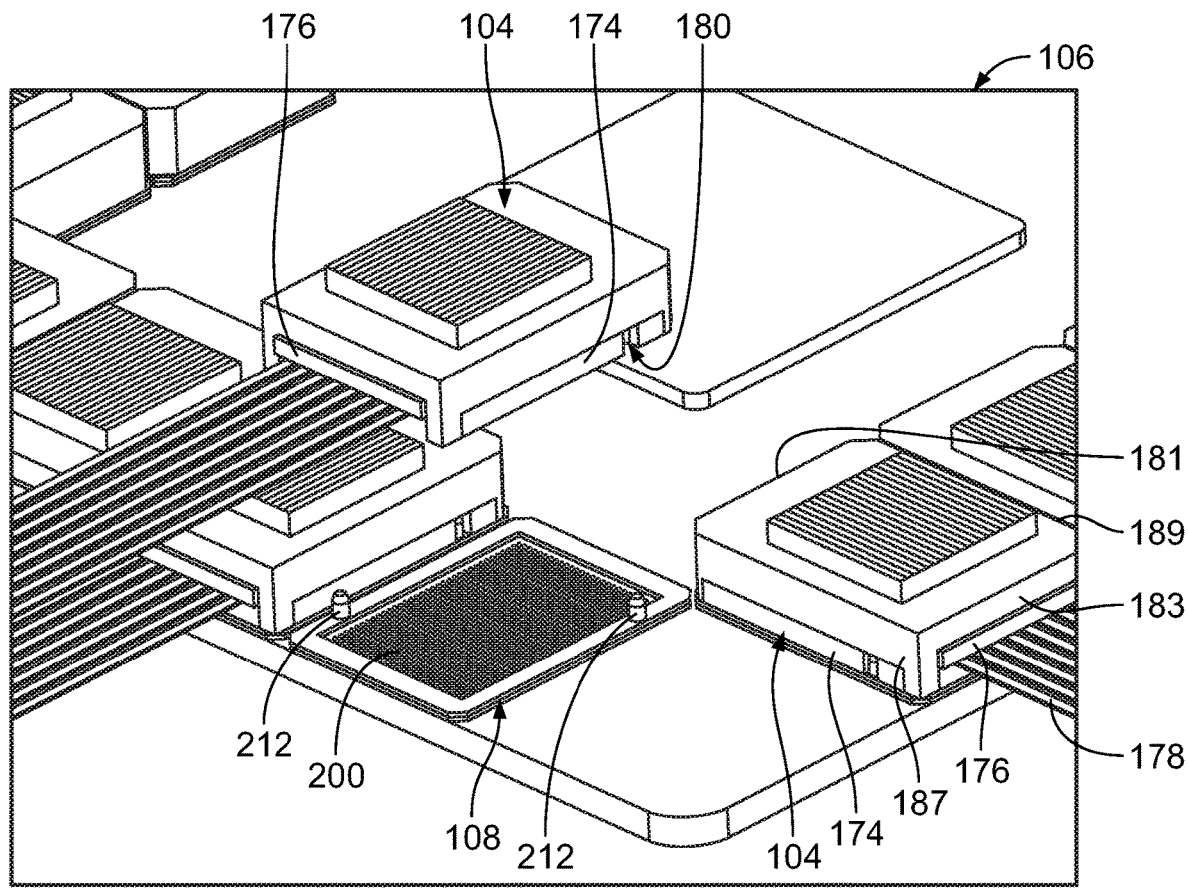
FIG. 10 is a perspective view of a portion of the electronic assembly in accordance with an exemplary embodiment.

FIG. 10 is a perspective view of a portion of the electronic assembly 102 in accordance with an exemplary embodiment showing one of the optical modules 104 poised for mating with the corresponding interposer assembly 108 and the electronic package 106. The locating features 180 of the optical module 104 are aligned with the upper locating pins 212 to locate the optical module 104 relative to the interposer assembly 108. The optical module substrate 174 is configured to be coupled to the interposer contacts 200 of the interposer assembly 108. For example, the optical module contacts on the bottom surface of the optical module substrate 174 are aligned with and coupled to corresponding interposer contacts 200. The optical module substrate 174 electrically connects the interposer contacts 200 with the optical engine 176. The optical engine 176 couples the optical cables 178 with the interposer contacts 200 via of the optical module substrate 174.

The optical modules 104 are arranged in optical module sets 191. The optical fibers 178 of each optical module 104 within the optical module set 191 extend in a common direction (for example, from the same side of the electronic package 106). The optical modules 104 are mounted to the electronic package 106 such that fronts 181 and rears 183 of the optical modules 104 within each optical module set 191 are aligned. The sides 187, 189 of the optical modules 104 within the optical module set 191 face each other and may abut against each other.

Figure 11:
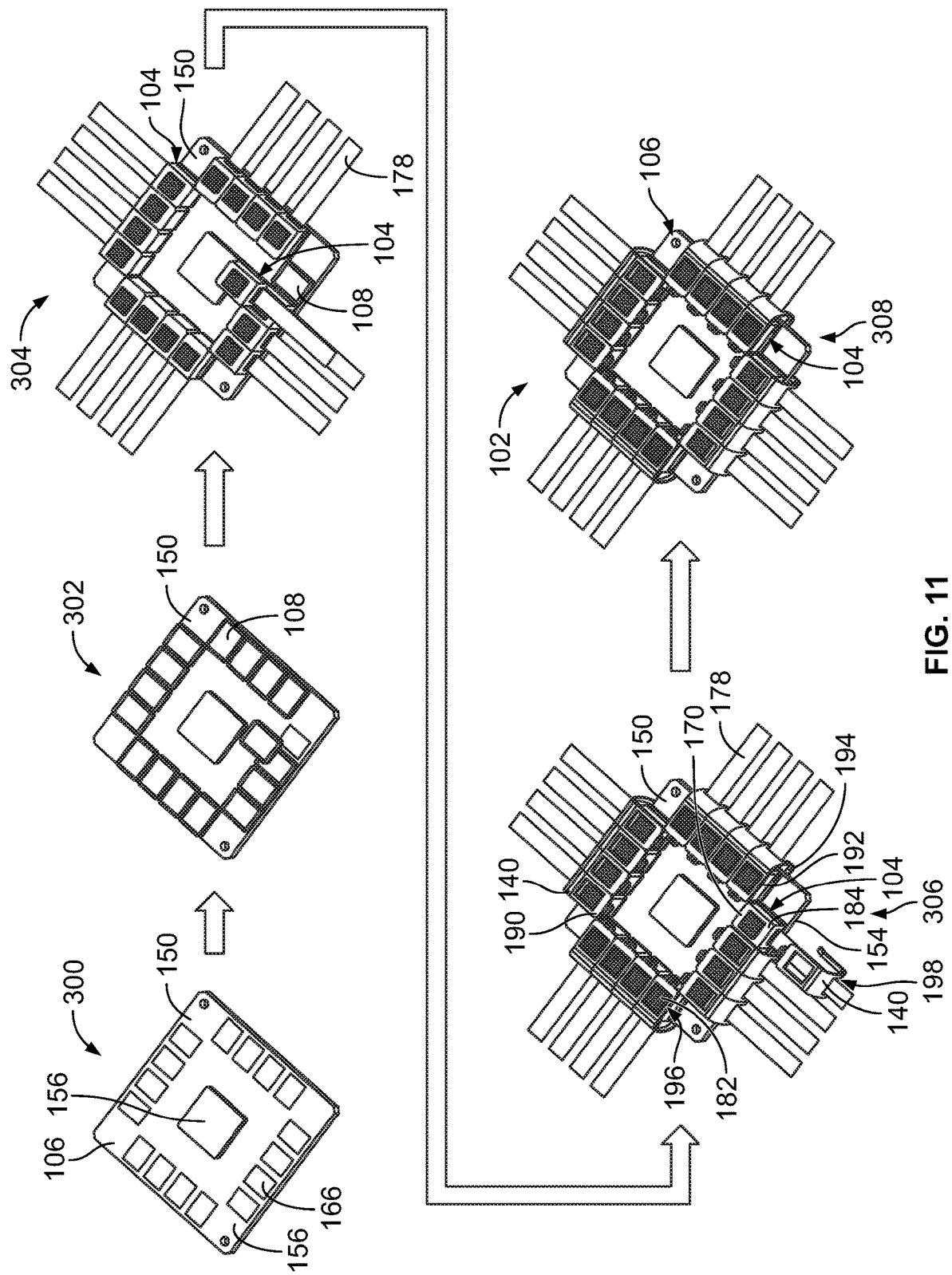
FIG. 11 is a flowchart showing assembly of the electronic assembly in accordance with an exemplary embodiment.

FIG. 11 is a flowchart showing assembly of the electronic assembly 102 in accordance with an exemplary embodiment. At 300, the electronic package 106 is provided including the integrated circuit component 156 and the upper package contacts 166 on the upper surface 152 of the package substrate 150. At 302, the interposer assemblies 108 are coupled to the package substrate 150. At 304, the optical modules 104 are coupled to the interposer assemblies 108. In the illustrated embodiment, the optical cables 178 extend generally horizontally from the electronic package 106, thus limiting the height of the electronic assembly 102.

At 306, the optical module compression members 140 are coupled to the optical modules 104. For example, the optical module compression members 140 are clipped onto the optical modules 104. The upper arms 192 of the optical module compression members 140 engage the top 184 of the corresponding optical module housing 170. The lower arm 194 engages the lower surface 154 of the package substrate 150. The optical module compression members 140 compressed the optical modules 104 downward against the interposer assemblies 108. The optical cables 178 extend from the sides of the electronic package 106, such as all four sides of the electronic package 106. In an exemplary embodiment, the optical module compression members 140 have sufficient compression forces to compress the interposer contacts 200. For example, the optical modules 104 are pressed downward by the biasing members 190 of the optical module compression members 140 to compress the interposer contacts 200 between the optical modules 104 and the electronic package 106. In an exemplary embodiment, the upper arm 192 engages the top 184 of the optical module housing 170 at multiple locations, such as around an entire periphery of the top 184 to spread the compressive forces around the entire optical module 104. In an exemplary embodiment, the opening 196 in the upper arm 192 receives the optical module heat sink 182. In an exemplary embodiment, the opening 198 in the lower arm 194 receives the optical cables 178.

At 308, the electronic assembly 102 is fully assembled. In an exemplary embodiment, the electronic assembly 102 may be tested, such as to test the electrical connections between each of the optical modules 104 and the interposer assemblies 108 and/or to test the electrical connections between each of the interposer assemblies 108 and the electronic package 106 area the testing may be performed prior to assembling the electronic assembly 102 with the socket connector 112, such as in a testing device, such as prior to shipping or sale of the electronic assembly 102.

Figure 12:
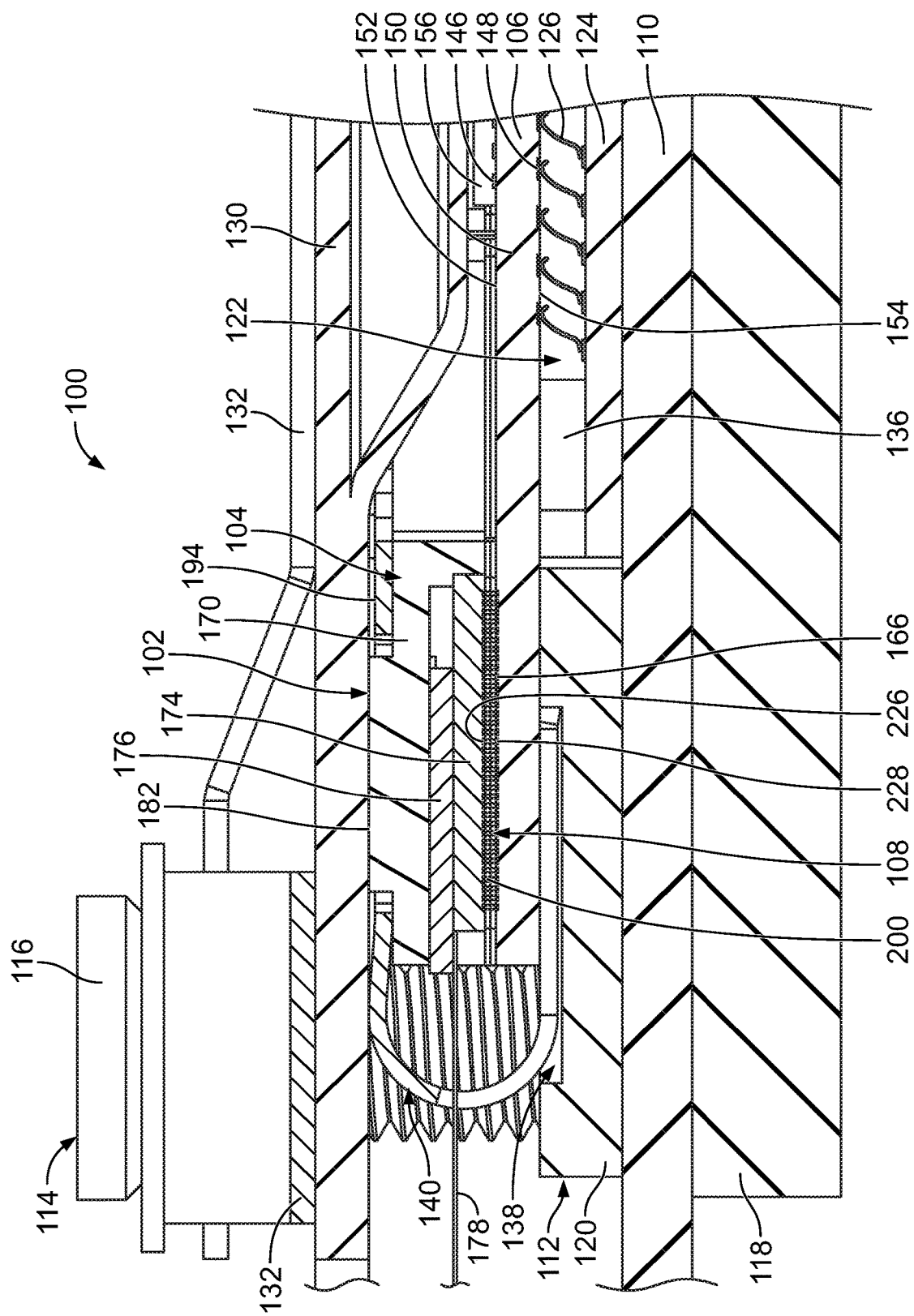
FIG. 12 is a cross-sectional view of a portion of the communication system showing the electronic assembly in accordance with an exemplary embodiment.

FIG. 12 is a cross-sectional view of a portion of the communication system 100 showing the electronic assembly 102 coupled to the socket connector 112 and the host circuit board 110. During assembly, the socket connector 112 is electrically connected to the host circuit board 110 at the board interface. The socket frame 120 is mounted to the top of the host circuit board 110. The socket substrate 124 is received in the socket opening 122 and electrically connected to the host circuit board 110. In an exemplary embodiment, the socket substrate 124 is connected to the host circuit board 110 using a BGA, a LGA, and the like. The socket frame 120 positions the socket substrate 124 relative to the host circuit board 110.

During assembly, the electronic assembly 102 is coupled to the socket connector 112. For example, the package substrate 150 is mounted to the top of the socket frame 120. The electronic assembly 102 is positioned to electrically connect the package substrate 150 with the socket contacts 126. In an exemplary embodiment, the socket connector 112 includes stop members 136 at the top of the socket substrate 124. The stop members 136 support the electronic package 106 relative to the socket substrate 124, such as to limit compression of the socket contacts 126 when the electronic package 106 is coupled to the socket connector 112.

In the illustrated embodiment, the socket contacts 126 are spring beams extending from the top of the socket substrate 124 defining a mating interface for mating with the electronic package 106. The spring beams are compressible to maintain electrical connection between the socket contacts 126 and the electronic package 106. In an exemplary embodiment, the compression assembly 114 is used to compress the electronic assembly 102 into the socket connector 112. The compression assembly 114 presses the electronic assembly 102 downward to compress the socket contacts 126.

In an exemplary embodiment, the electronic package 106 includes lower package contacts 148 along the lower surface 154 of the package substrate 150. The lower package contacts 148 are electrically connected to corresponding socket contacts 126. In the illustrated embodiment, the lower package contacts 148 are contact pads provided on the lower surface 154 of the package substrate 150. The lower package contacts 148 are electrically connected to package contacts 146 of the electronic package 106. The package contacts 146 are provided on the upper surface 152. The package contacts 146 are electrically connected to the integrated circuit component 156. In an exemplary embodiment, power and low-speed data signals are transmitted between the lower package contacts 148 and corresponding package contacts 146. In an exemplary embodiment, the upper package contacts 166 are electrically connected to corresponding package contacts 146. In various embodiments, the upper package contacts 166 may be electrically connected to corresponding lower package contacts 148. For example, power may be supplied to the optical module 104 along traces between corresponding upper package contacts 166 and lower package contacts 148.

When assembled, the optical module compression members 140 are coupled to the optical modules 104 to press the optical modules 104 downward. In an exemplary embodiment, the lower arm 194 is received in a pocket 138 at the top of the socket frame 120 such that the package substrate 150 may rest on the top of the socket frame 120. The optical module compression members 140 create a reliable electrical connection between the optical module 104 and the interposer assembly 108 and create a reliable electrical connection between the interposer assembly 108 and the package substrate 150. The interposer contacts 200 are compressed between the optical module 104 and the package substrate 150. The upper mating interfaces 226 of the interposer contacts 200 are electrically connected to optical module contacts 175 at the bottom of the optical module substrate 174. The lower mating interfaces 228 of the interposer contacts 200 are electrically connected to the upper package contacts 166 at the upper surface 152 of the package substrate 150. The optical engine 176 provides an interface between the optical module substrate 174 and the optical cables 178.

During assembly, the compression assembly 114 is used to compress the electronic assembly 102 against the socket connector 112. For example, the load plate 130 may be compressed against the integrated circuit component 156. In an exemplary embodiment, the load plate 130 defines a heat sink configured to dissipate heat from the integrated circuit component 156. The load plate 130 is loaded by (for example, pressed downward by) the compression members 132. The compression members 132 are compressed downward using the compression hardware 116, which is threadably coupled to the bolster plate 118. As the compression hardware 116 is tightened, the compression members 132 are compressed and pressed downward against the load plate 130. The load plate 130 is similarly pressed downward against the electronic assembly 102. In an exemplary embodiment, the compression assembly 114 is used to compress the optical modules 104 against the interposer assemblies 108. For example, the load plate 130 may pressed downward against the optical module compression members 140 and/or the optical module housing 170 and/or the optical module heat sink 182 to press the optical module 104 downward into the interposer assembly 108. In an exemplary embodiment, the load plate 130 is in thermal engagement with the optical module heat sink 182 to dissipate heat from the optical module 104. The load plate 130 functions as a heat sink for the optical module 104. The load plate 130 provides a clamping force for the electronic assembly 102 to the socket connector 112 and provides a clamping force for multiple optical modules 104. The load plate 130 defines an integrated, unified heat sinking surface for the optical modules 104 while allowing a separate and discrete force to be applied to the optical modules 104 for compressing the interposer assemblies 108.

Figure 13:
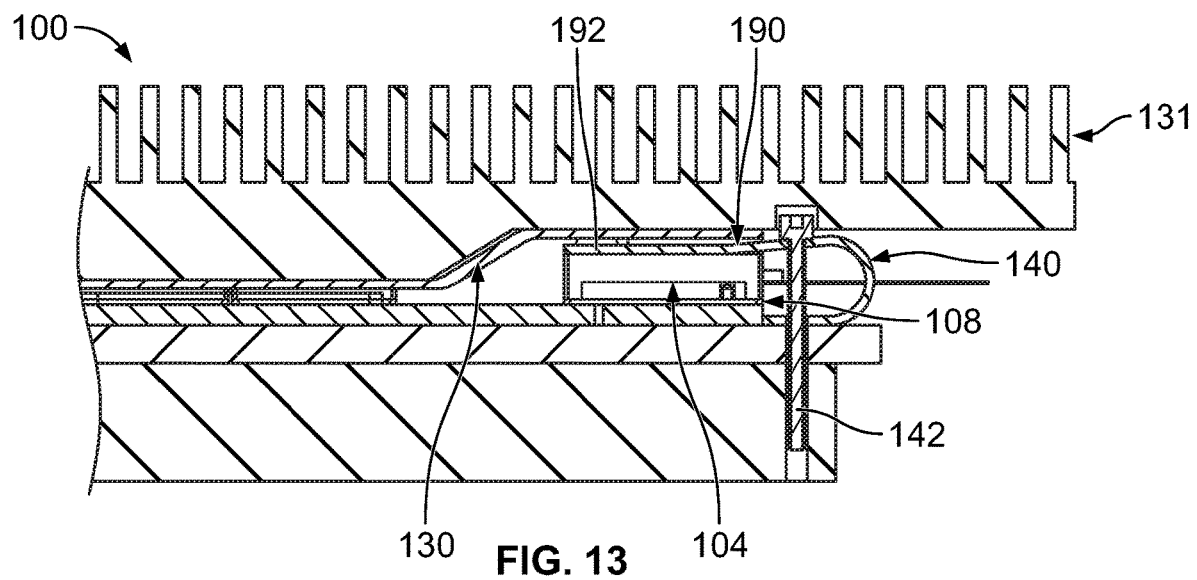
FIG. 13 is a cross-sectional view of a portion of the communication system in accordance with an exemplary embodiment.

FIG. 13 is a cross-sectional view of a portion of the communication system 100 in accordance with an exemplary embodiment. In the illustrated embodiment, the optical module compression member 140 includes optical module compression hardware 142 coupled to the biasing member 190 to provide downward biasing force on the biasing member 190. For example, the optical module compression hardware 142 engages the upper arm 192 to press downward on the upper arm 192. The downward pressure on the upper arm 192 is transferred to the optical module 104 to press the optical module 104 downward against the interposer assembly 108. In an exemplary embodiment, the communication system 100 includes a heat sink 131 coupled to or integral with the load plate 130.

Figure 14:
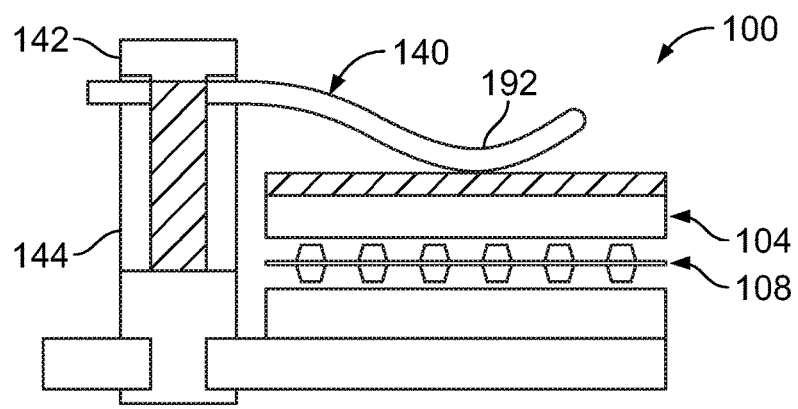
FIG. 14 is a cross-sectional view of a portion of the communication system in accordance with an exemplary embodiment.

FIG. 14 is a cross-sectional view of a portion of the communication system 100 in accordance with an exemplary embodiment. In the illustrated embodiment, the optical module compression member 140 is provided without the lower arm 194 (shown in FIG. 12). The optical module compression member 140 utilizes the optical module compression hardware 142 to engage in pressed downward on the upper arm 192. In an exemplary embodiment, the optical module compression hardware 142 is received in a threaded insert 144. As the compression hardware 142 is tightened into the threaded insert 144, the upper arm 192 provides downward biasing force on the optical module 104 to press the optical module 104 downward against the interposer assembly 108.

Figure 15:
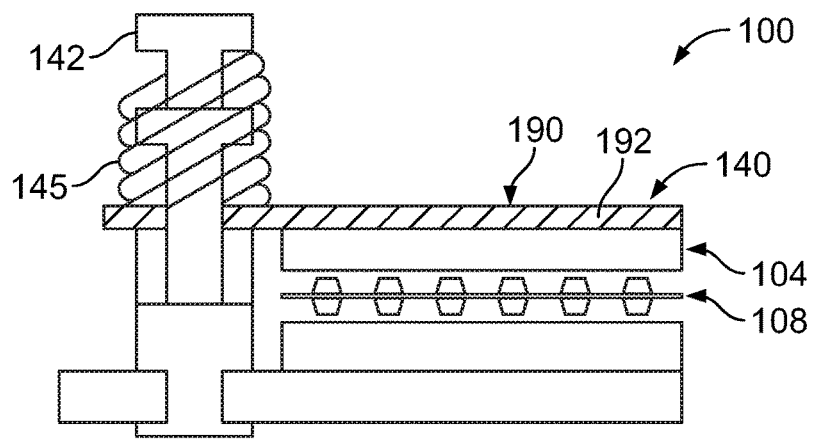
FIG. 15 is a cross-sectional view of a portion of the communication system in accordance with an exemplary embodiment.

FIG. 15 is a cross-sectional view of a portion of the communication system 100 in accordance with an exemplary embodiment. In the illustrated embodiment, the optical module compression member 140 it is provided without the lower arm 194 (shown in FIG. 12). The optical module compression member 140 utilizes a spring member 145, such as a coil spring, between the optical module compression hardware 142 and the upper arm 192 of the biasing member 190. As the compression hardware 142 is tightened, the coil spring is compressed and forced downward against the upper arm 192, which provides downward biasing force on the optical module 104 to press the optical module 104 downward against the interposer assembly 108.

Figure 16:
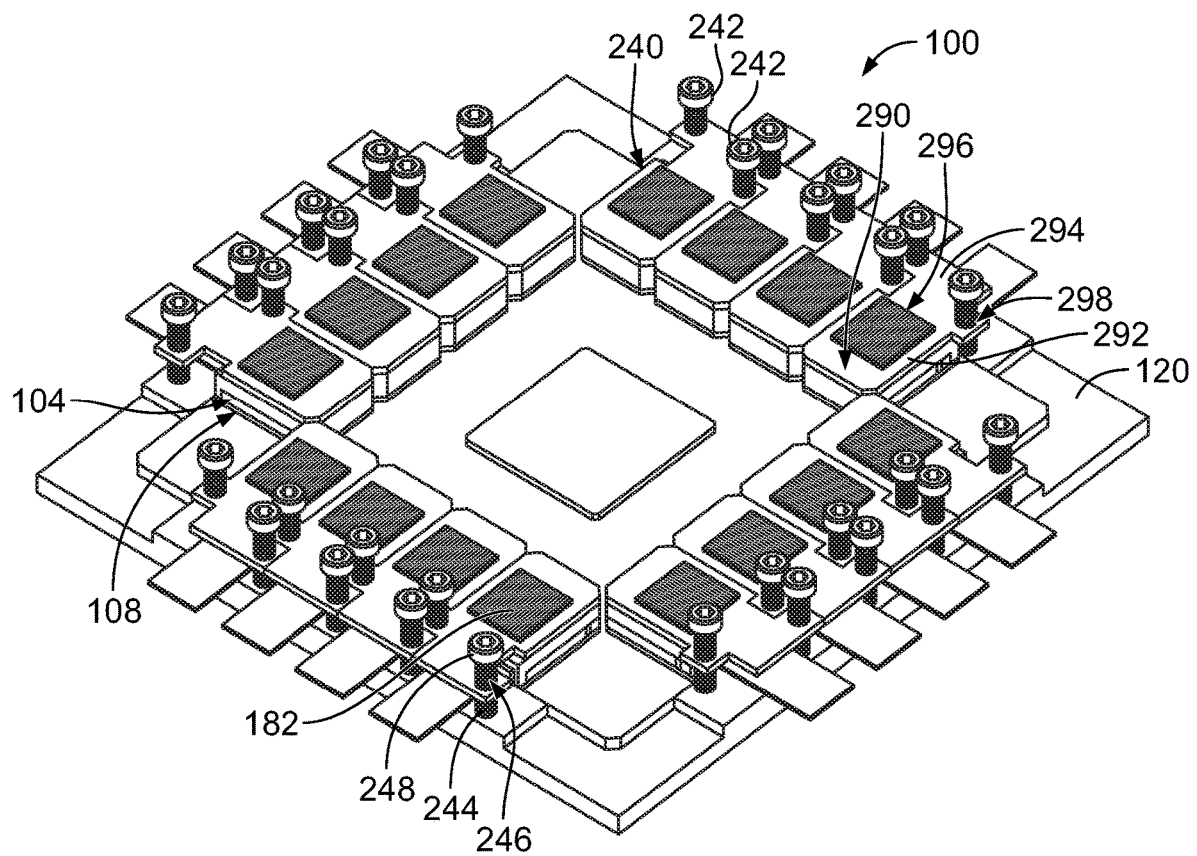
FIG. 16 is a perspective view of a portion of the communication system in accordance with an exemplary embodiment.
Figure 17:
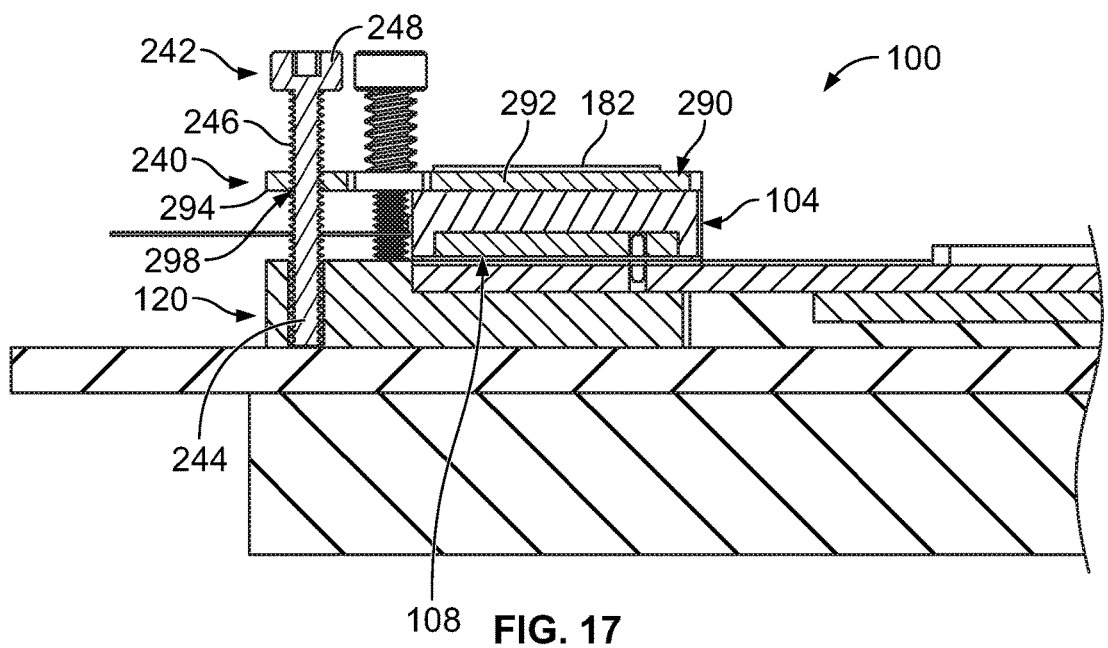
FIG. 17 is a cross-sectional view of a portion of the communication system in accordance with an exemplary embodiment.

FIG. 16 is a perspective view of a portion of the communication system 100 in accordance with an exemplary embodiment, showing alternative optical module compression members 240 used to compress the optical modules 104 against the interposer assemblies 108. FIG. 17 is a cross-sectional view of a portion of the communication system 100 including the optical module compression members 240.

Each optical module compression member 240 includes a biasing member 290 engaging the top of the optical module 104. In the illustrated embodiment, the biasing member 290 includes a plate 292 engaging the top of the optical module 104 and an extension 294 extending from the plate 292. The plate 292 includes an opening 296 that receives the optical module heat sink 182. The extension 294 includes openings 298 that receive optical module compression hardware 242. In the illustrated embodiment, the optical module compression hardware 242 includes a threaded fastener 244 having a spring member 246 captured between a head 248 of the threaded fastener 244 and the biasing member 290. The spring member 246 presses the biasing member 290 downward against the optical module 104. In the illustrated embodiment, the threaded fasteners 244 are threadably coupled to the socket frame 120.

In an exemplary embodiment, an electronic assembly is provided including an electronic package including a package substrate having an upper surface and a lower surface, the electronic package including an integrated circuit component mounted to the upper surface of the package substrate, the electronic package includes lower package contacts electrically connected to the integrated circuit component and configured to be electrically connected to a host circuit board, the electronic package includes upper package contacts electrically connected to the integrated circuit component; an interposer assembly including an array of interposer contacts, the interposer contacts being compressible, each interposer contact having an upper mating interface and a lower mating interface, the lower mating interfaces of the interposer contacts are mated with the upper package contacts; optical modules coupled to the upper surface of the package substrate, each optical module including an optical module substrate having module contacts and an optical engine mounted to the optical module substrate electrically connected to the module contacts, the optical module being mounted to the interposer assembly such that the module contacts are electrically connected to the upper mating interfaces of the interposer contacts, each optical module including at least one optical fiber terminated to the optical engine; and optical module compression members coupled to the optical modules, the optical module compression members compressing the compressible interposer contacts between the optical modules and the electronic package.

In various embodiments, the optical module compression member includes a spring clip compressing the optical module against the interposer assembly. In various embodiments, the optical module compression member includes a spring clip including an upper arm and a lower arm, the upper arm engaging the optical module, the lower arm engaging the lower surface of the package substrate to compress the optical module against the interposer contacts. In various embodiments, the optical module compression member includes a compression plate and compression hardware engaging and pressing the compression plate downward onto the optical module. In various embodiments, the optical module compression member includes a spring element and compression hardware engaging the spring element and pressing the spring element downward into the optical module.

In an exemplary embodiment, a communication system is provided including a socket connector includes a socket frame having a socket opening receiving a socket substrate, the socket substrate including socket contacts, the socket contacts being compressible, the socket connector configured to be mounted to a host circuit board, the socket substrate being electrically connected to the host circuit board at a board interface; an electronic assembly coupled to the socket connector, the electronic assembly including an electronic package including a package substrate having an upper surface and a lower surface, the electronic package including an integrated circuit component mounted to the upper surface of the package substrate, the electronic package includes lower package contacts electrically connected to the integrated circuit component, the lower package contacts being electrically connected to the socket contacts, the electronic package includes upper package contacts electrically connected to the integrated circuit component, the electronic assembly including an interposer assembly including an array of interposer contacts, the interposer contacts being compressible, each interposer contact having an upper mating interface and a lower mating interface, the lower mating interfaces of the interposer contacts are mated with the upper package contacts, the electronic assembly including optical modules coupled to the upper surface of the package substrate, each optical module including an optical module substrate having module contacts and an optical engine mounted to the optical module substrate electrically connected to the module contacts, the optical module being mounted to the interposer assembly such that the module contacts are electrically connected to the upper mating interfaces of the interposer contacts, each optical module including at least one optical fiber terminated to the optical engine; and a compression assembly including a load plate mounted to the electronic assembly, the compression assembly including a compression member engaging the load plate to press the load plate downward, the load plate being coupled to the electronic package to compress the socket contacts and electrically connect the lower package contacts to the socket contacts.

In various embodiments, the load plate engages the optical module to compress the optical module downward toward the interposer assembly. In various embodiments, the optical module includes an optical module heatsink engaging in dissipating heat from the optical engine, the load plate being thermally conductive, the load plate engaging the optical module heatsink of each of the optical modules to dissipate heat from the optical module heat sinks. In various embodiments, the socket contacts transmit power and low speed signals between the host circuit board and the electronic package, the interposer assembly transmitting high speed signals between the electronic package and the optical modules.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electronic assembly comprising:
an electronic package including a package substrate having an upper surface and a lower surface, the electronic package including an integrated circuit component mounted to the upper surface of the package substrate, the electronic package includes lower package contacts electrically connected to the integrated circuit component and configured to be electrically connected to a host circuit board, the electronic package includes upper package contacts electrically connected to the integrated circuit component;
at least one interposer assembly including an array of interposer contacts, the interposer contacts being compressible, each interposer contact having an upper mating interface and a lower mating interface, the lower mating interfaces of the interposer contacts are mated with the upper package contacts, the interposer assembly defining a separable interface; and
optical modules coupled to the separable interface of the at least one interposer assembly, each optical module including an optical module substrate having module contacts and an optical engine mounted to the optical module substrate electrically connected to the module contacts, the optical modules being mounted to the at least one interposer assembly such that the module contacts are electrically connected to the upper mating interfaces of the at least one interposer contacts, the optical modules being separately removable from the at least one interposer assembly, each optical module including at least one optical fiber terminated to the optical engine.

2. The electronic assembly of claim 1, wherein the interposer contacts comprise conductive polymer columns held in the array by a support plate, the upper mating interfaces being located above the support plate, the lower mating interfaces being located below the support plate.

3. The electronic assembly of claim 1, wherein the upper mating interfaces are compressible and the lower mating interfaces are compressible.

4. The electronic assembly of claim 1, wherein the interposer contacts include deflectable spring beams.

5. The electronic assembly of claim 1, wherein the interposer assembly includes an interposer frame holding a support plate, the support plate holding each of the interposer contacts in the array, the interposer frame including lower locating pins engaging the package substrate to locate the interposer assembly relative to the upper package contacts, the interposer frame including upper locating pins engaging the optical module to locate the optical module relative to the interposer contacts.

6. The electronic assembly of claim 5, wherein the optical module includes an optical module housing holding the optical engine and the optical module substrate, the optical module housing engaging the upper locating pins to locate the optical module substrate relative to the interposer contacts.

7. The electronic assembly of claim 1, wherein the optical module includes an optical module heatsink engaging and dissipating heat from the optical engine.

8. The electronic assembly of claim 7, further comprising a heat spreader engaging the optical module heat sinks of each of the optical modules.

9. The electronic assembly of claim 7, wherein the optical module heatsink includes a plurality of plates at a top of the optical module.

10. The electronic assembly of claim 7, wherein the heat sink includes a compressible thermal interface.

11. The electronic assembly of claim 1, further comprising optical module compression members coupled to the optical modules, the optical module compression members compressing the interposer contacts between the optical modules in the electronic package.

12. The electronic assembly of claim 11, wherein the optical module compression member includes a spring clip including an upper arm and a lower arm, the upper arm engaging the optical module, the lower arm engaging the lower surface of the package substrate to compress the optical module against the interposer contacts.

13. The electronic assembly of claim 11, wherein the optical module compression member includes a compression plate and compression hardware engaging and pressing the compression plate downward onto the optical module.

14. The electronic assembly of claim 11, wherein the optical module compression member includes a spring element and compression hardware engaging the spring element and pressing the spring element downward into the optical module.

15. The electronic assembly of claim 11, further comprising a compression assembly including a load plate mounted to the electronic assembly, the compression assembly including a compression member engaging the load plate to press the load plate downward into the optical modules independent of the optical module compression members.

16. The electronic assembly of claim 1, wherein the at least one interposer assembly includes a plurality of interposer assemblies, each interposer assembly receiving a corresponding optical module.

17. The electronic assembly of claim 1, wherein the package substrate includes edges around the perimeter of the package substrate, the package substrate including mounting areas between the integrated circuit and the edges, each mating area receiving a plurality of the optical modules.

18. The electronic assembly of claim 1, wherein each optical module includes a front, a rear, a top, a bottom, and sides extending between the front and the rear, the optical modules being arranged in optical module sets, the optical fibers extending from the rears of the optical modules, the optical fibers of each optical module within the optical module set extending in a common direction, the fronts of each optical module within the optical module set being aligned, the sides of the optical modules within the optical module set facing each other.

19. The electronic assembly of claim 1, further comprising a compression assembly including a load plate mounted to the electronic assembly, the compression assembly including a compression member engaging the load plate to press the load plate downward, the load plate compressing the optical modules downward into the at least one interposer assembly.

20. The electronic assembly of claim 19, wherein the load plate includes a heat spreader thermally coupled to each of the optical modules, the heat spreader being thermally coupled to the integrated circuit component.

* * * * *